United States Patent [19]

Menant

[11] 4,270,222
[45] May 26, 1981

[54] RADIO-FREQUENCY HEAD HAVING A SELF-ADAPTIVE DYNAMIC RANGE

[75] Inventor: Christophe Menant, Paris, France
[73] Assignee: Thomson-CSF, Paris, France
[21] Appl. No.: 131,181
[22] Filed: Mar. 17, 1980

[30] Foreign Application Priority Data

Mar. 20, 1979 [FR] France .............................. 79 07012

[51] Int. Cl.³ .............................................. H04B 1/26
[52] U.S. Cl. .................................. 455/236; 455/249; 455/250; 455/251; 455/318
[58] Field of Search .............................. 455/234–236, 455/239, 241, 247–251, 254, 318–320

[56] References Cited

U.S. PATENT DOCUMENTS

| | | | |
|---|---|---|---|
| 1,905,946 | 4/1933 | Mathieu et al. | 455/251 |
| 2,144,935 | 1/1939 | Roberts | 455/236 |
| 3,052,853 | 9/1962 | Smith | 455/250 |
| 3,104,357 | 9/1963 | Birkenes | 455/236 |
| 3,394,315 | 7/1968 | Gray | 455/239 |
| 3,457,514 | 7/1969 | Lancaster | 455/236 |
| 3,518,585 | 6/1970 | Wilcox | 455/249 |
| 3,805,162 | 4/1974 | Hoffman et al. | 455/236 |
| 3,946,318 | 3/1976 | Gruber | 455/319 |

FOREIGN PATENT DOCUMENTS 469428  7/1937  United Kingdom ..................... 455/236

*Primary Examiner*—Marc E. Bookbinder

[57] ABSTRACT

An HF receiver head having high sensitivity and capable of receiving variable-level input signals has characteristics which are adjusted as a function of the received signal level. The HF head essentially comprises a generator for delivering control voltages as a function of the amplitude of the received signals. The dynamic range of the input amplifier and of the mixer can thus be varied as a function of the received signal level up to a predetermined threshold value. Above this threshold value, an input attenuator assumes increasing values which makes it possible to attain a wide dynamic range of the HF head under optimum conditions of sensitivity and linearity.

3 Claims, 3 Drawing Figures

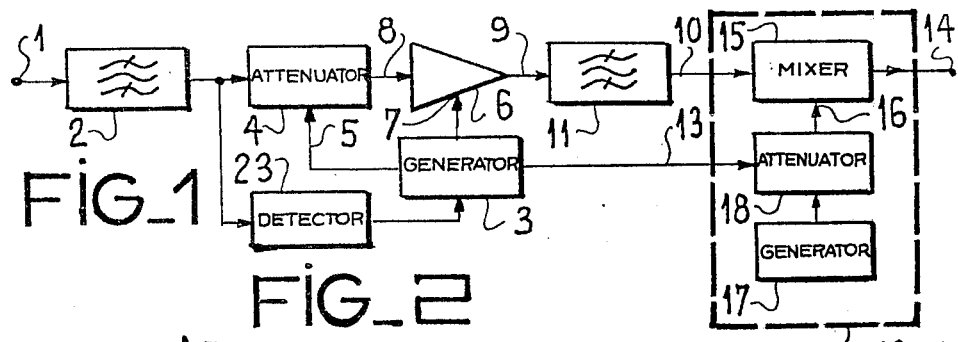
FIG_1
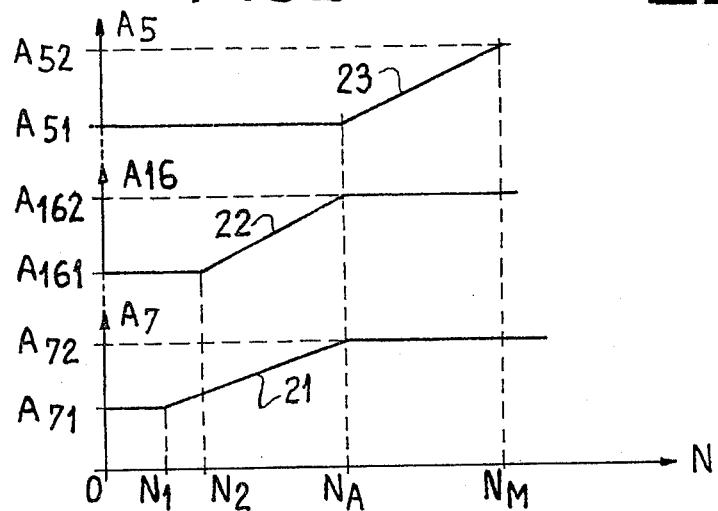
FIG_2
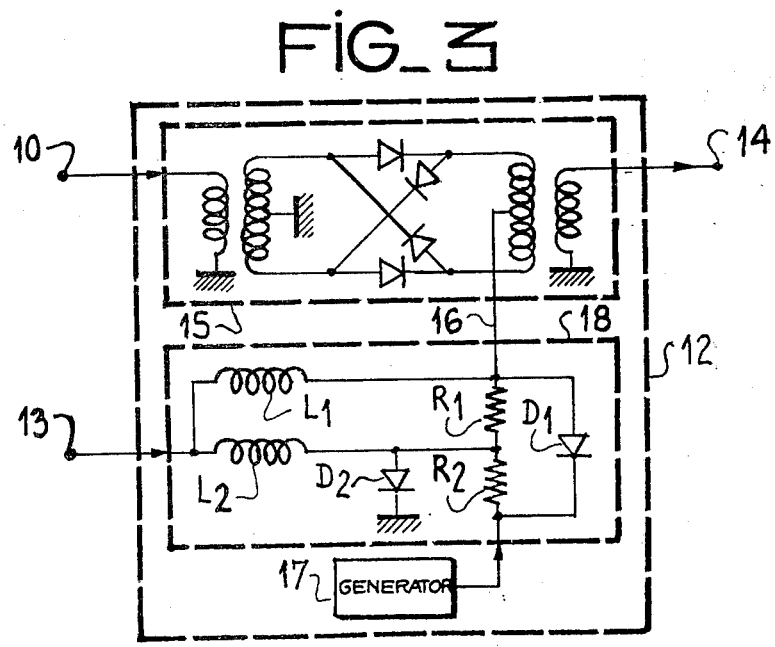
FIG_3

RADIO-FREQUENCY HEAD HAVING A SELF-ADAPTIVE DYNAMIC RANGE

This invention relates to radio-frequency heads of the type provided in receivers subjected to parasitic signals of very variable level and having a dynamic range which is self-adaptive as a function of said level. The invention further relates to receivers comprising heads of this type which will be designated hereinafter by the usual term "HF head".

The reception of small signals in an intense interference field produced for example by the local emitter of a duplex link calls for special arrangements in the input amplification circuits of the receivers in order to prevent modulation of the gain of these latter according to the intensity of said field, thereby resulting in reduced sensitivity of the receiver accompanied by transmodulation and a potential danger of intermodulation.

With this objective, one known practice consists in providing within the HF head a linear input stage for sufficiently high levels but this result is obtained at the cost of high power consumption and a high noise factor irrespective of the level of the signal received.

Another known practice when the HF head is provided with an amplifying stage consists in adapting its operating point automatically to the level of the signals received.

This solution makes it possible to optimize the power consumption and the noise factor of the amplifier as a function of the signal level received but this becomes a reasonable possibility only within a dynamic range of input level which is insufficient with respect to the dynamic range of levels actually received. Moreover, the mixing stage which usually follows said amplifying stage must be designed to accept signal levels which may be of a high order.

The present invention is intended to overcome the various disadvantages mentioned in the foregoing.

To this end, the invention is directed to an HF head having one input and one output and comprising:

a stage for converting signals received in which provision is made for a local oscillation generator and a mixer and which has one signal input, one output and one input for controlling the level of local oscillation;

a variable attenuator having one signal input coupled to the input of the HF head, one output coupled to the signal input of the converter stage, and one input for controlling its attenuation coefficient;

means having one input and one output for detecting the level of signals received;

control means having one input coupled to the output of the detection means and at least one first output for delivering a first control signal, and one second output for delivering a second control signal, said outputs being coupled respectively to the control inputs of the converter stage and of the attenuator in order to ensure that the level of the local oscillation current and the coefficient of attenuation of the attenuator between predetermined limiting values of the received signal level are of successively increasing value as a function of said received signal level.

A more complete understanding of the invention will be gained from the following description in which further distinctive features will become apparent, reference being made to the accompanying drawings in which:

FIG. 1 is a schematic diagram of one example of a receiving HF head according to the invention;

FIG. 2 is an explanatory diagram of operation of the HF head of FIG. 1;

FIG. 3 shows one example of construction of an element of FIG. 1.

An input terminal 1 is connected via a band-pass filter 2 to a variable attenuator 4 having a control input 5 and to a control signal generator 3 via a detector 23. A self-adapting dynamic range amplifier 6 has a control input 7 and a signal input 8, said signal input being connected to the output of the attenuator 4 and the output 9 of said amplifier being connected via a band-pass filter 11 to a signal input 10 of a frequency converter 12 having a control input 13 and an output 14.

Said frequency converter 12 comprises a mixer 15 inserted between its input 10 and its output 14 and having a local oscillation signal input 16 connected to a generator 17 via a variable attenuator 18, a control input of which is connected to the control input 13.

A more complete understanding of the operation of the device will be gained from the following figure.

In FIG. 2, the curve 21 represents the variation in amplitude $A_7$ of the bias voltage of the amplifier 6 as applied to its control input 7 as a function of the input level N of signals applied to the generator 3 via the detector 23. Said amplitude has a minimum value $A_{71}$ in respect of received signal levels below a level $N_1$ to which a minimum noise factor and power consumption correspond in the case of the amplifier 6. In regard to received signal levels which increase in value from the level $N_1$, the amplitude $A_7$ of the bias voltage increases in such a manner as to extend the dynamic range of the amplifier by a quantity which is just sufficient to maintain satisfactory linearity of said amplifier in respect of the corresponding input level and thus to obtain the best compromise between the linearity and the noise factor.

It will readily be apparent that the abovementioned increase in bias voltage has technological limits and the bias voltage level $A_{72}$ will remain constant in respect of any received signal level above a value $N_A$.

The curve 23 represents as a function of the same input level N the variations in amplitude $A_5$ of the control voltage applied to the input 5 of the attenuator 4. In the case of received signal levels below $N_A$, the amplitude $A_5$ assumes a constant value $A_{51}$ corresponding to an attenuation value which is practically zero in the case of the attenuator 4. In the case of received signal levels which are higher than $N_A$, the voltage amplitude $A_5$ increases linearly as a function of the input level so as to maintain a constant level at the input of the amplifier 6. The amplitude $A_{52}$ corresponds to the maximum value of attenuation of the attenuator 4 to which the maximum received signal level $N_M$ corresponds; said maximum level represents the limiting value of the dynamic range of the HF head as a whole.

The curve 22 represents the variation in the amplitude $A_{16}$ of the local oscillation current transmitted to the mixer 15; said variation is related to the variation in the coefficient of attenuation of the attenuator 18 and controls the dynamic range of the mixer 15. Said mixer contributes to the overall noise factor of the HF head and must have a minimum noise factor in respect of received signal levels of very low value; this is normally the case at the minimum value $A_{161}$ of the local oscillation current and therefore at a maximum value of the coefficient of attenuation of the attenuator 18.

Let $N_2$ be the received signal level above which the mixer begins to be saturated or in other words to lose its linearity; starting from this value, it is necessary to increase the dynamic range of the mixer. This means that it is in fact necessary to increase the local oscillation current and therefore to reduce the value of the coefficient of attenuation of the attenuator 18 as a function of the received signal level N.

The current $A_{16}$ will therefore increase until the value $A_{162}$ is attained in respect of a received signal level $N_A$ and said value $A_{162}$ will then be maintained constant above said received level $N_A$ since the attenuator 4 will have the function of maintaining it at a constant level at the input, at least up to the received level $N_M$.

The next figure gives one example of construction of the frequency converter 12.

In FIG. 3, references which are identical with those of FIG. 1 designate the same elements. In this figure, the mixer 15 is shown in the form of a conventional ring modulator having four diodes, the input 16 of which is the switching voltage input, the incident signal being applied to the input 10. Said input 16 receives the current delivered at the output of the local oscillator 17 via the bridged-T attenuator 18 constituted by a pair of series resistors $R_1$ and $R_2$ having the same value and connected in parallel with a first variable-resistance diode $D_1$, the anode and the cathode of which are connected respectively to the free ends of the resistors $R_1$ and $R_2$ and by a second variable-resistance diode $D_2$, the cathode of which is connected to ground and the anode of which is connected to the common node of the resistors $R_1$ and $R_2$. The control input 13 is connected to the anodes of the diodes $D_1$ and $D_2$ via the respective blocking inductance coils $L_1$ and $L_2$.

In the case of a zero voltage applied to the diodes via the input 13, said diodes have a high resistance and the attenuator has a maximum coefficient of attenuation corresponding to the local oscillation current $A_{161}$, thus making it possible to obtain a minimum noise factor of the mixer which will remain linear in the case of received signal levels equal at a maximum to $N_2$.

In the case of increasing received-signal levels, the control voltage of the attenuator 18 will also rise, thus reducing the resistance of the diodes $D_1$ and $D_2$ and therefore the attenuation coefficient. This produces an increase in the local oscillation level and consequently in the dynamic range in relation to the increased signal level which has brought about this increase. The current $A_{16}$ no longer increases when the received signal level attains the value $N_A$ above which the attenuator 4 comes into action and to which the value $A_{162}$ of the current $A_{16}$ corresponds. The principle of construction of the attenuator 18 can be applied to the attenuator 4 but with a reversal of the sign of the voltage or of the connection of the diodes since the attenuator 4 must have an attenuation which increases in value with the control voltage in contrast to the attenuator 18.

It is thus clearly apparent that the HF head hereinabove described exhibits an optimum noise factor in respect of low received-signal levels while retaining good linearity over a dynamic range having a high input level corresponding in particular to the presence of parasitic signals and limits impairment of the noise factor to the strict minimum corresponding to the dynamic range which is necessary for each given value of input level.

It is readily apparent that the embodiment hereinabove described extends to a large number of alternative forms.

In particular, the variation in the local oscillation level applied to the mixer 15 can be obtained by direct action on the oscillator 17. This will have the effect of reducing the power consumption of the oscillator and may prove advantageous in the case of transported equipment in which low power consumption is a desirable objective.

Distribution of the selectivity of the receiver between the two band filters 2 and 11 is not directly related to the invention. This distribution is carried out in such a manner as to obtain the best compromise at the input of the HF head between the noise factor and the products of intermodulation which vary in inverse proportion to the performances of the filter. In fact, as the filter exhibits higher out-of-band attenuation, so it provides better protection against intermodulations but also results in higher insertion losses and therefore in degradation of the noise factor.

In the example hereinabove described, the input of the detector 23 is connected to the output of the filter 2. The operation of the device remains unchanged if said input is connected to the input 8 of the amplifier 6, to the output 9 of said amplifier or to the output of the filter 11.

Similarly, it is assumed in the foregoing description that the amplifier 6 is saturated before the mixer 15. As will be readily understood, their respective points of saturation can also be identical or reversed, especially as a function of the gain of the amplifier 6.

Finally, the device is clearly applicable to HF heads without input amplification, especially at very high frequencies at which the action of the device 3 is limited to that of controlling the dynamic range of the mixer 15 and the value of attenuation of the attenuator 4.

What is claimed is:

1. An HF head having one input and one output and comprising:
    a stage for converting received signals in which provision is made for a local oscillation generator and a mixer and which stage has one signal input, one output and one input for controlling the level of local oscillation;
    a variable attenuator having one signal input coupled to the input of the HF head, one output coupled to the signal input of the converter stage, and one input for controlling its attenuation coefficient;
    means having one input and one output for detecting the level of signals received;
    control means having one input coupled to the output of the detection means and at least one first output for delivering a first control signal, and one second output for delivering a second control signal, said first and second outputs being coupled respectively to the control inputs of the converter stage and of the attenuator in order to ensure that the level of the local oscillation current and the coefficient of attenuation of the attenuator between predetermined limiting values of the received signal level are of successively increasing value as a function of increasing received signal level.

2. An HF head according to claim 1, wherein the output of the attenuator is coupled to the input of the converter stage via an amplifying stage having one input for controlling the dynamic range of the signal applied thereto, the control means being provided in addition with a third output coupled to the control input of said amplifying stage.

3. An HF head according to claim 1 or claim 2, wherein the input of the detection means is connected to any one of the points of said HF head between the signal input of the attenuator and the output of the converter stage.

* * * * *